United States Patent [19]

Corr et al.

[11] Patent Number: 5,018,144

[45] Date of Patent: May 21, 1991

[54] LOGIC PERFORMANCE VERIFICATION AND TRANSITION FAULT DETECTION

[75] Inventors: James L. Corr, Shelburne; Brian J. Vincent, Essex Junction, both of Vt.

[73] Assignee: International Business Machines Corporation, Armonk, N.Y.

[21] Appl. No.: 345,758

[22] Filed: Apr. 28, 1989

[51] Int. Cl.$^5$ .............................................. G06F 11/00
[52] U.S. Cl. ................................................ 371/22.3
[58] Field of Search ................... 371/22.3, 25.1, 22.1, 371/15.1, 61; 324/158 R, 73.1

[56] References Cited

U.S. PATENT DOCUMENTS

| | | | |
|---|---|---|---|
| 4,476,431 | 10/1984 | Blum | 371/22.3 |
| 4,513,418 | 4/1985 | Bardell | 371/22.3 |
| 4,698,830 | 10/1987 | Barzilai | 371/22.3 X |

OTHER PUBLICATIONS

T. Lo, "LSSD Implemented with DCVS Logic", IBMTDB, vol. 26; No. 11, 4/1984, pp. 5805-5810.

Primary Examiner—Jerry Smith
Assistant Examiner—Robert W. Beausoliel
Attorney, Agent, or Firm—Mark F. Chadurjian

[57] ABSTRACT

In scan testing of logic parts, this invention provides an inexpensive transition fault test by changing the sequence of application of the A/C and B clocks. In each machine test cycle the B clock is triggered first, and the A/C clock is triggered second. The periodicity of the clocks is not changed for a particular cycle, because in one cycle the B-to-A/C clocking that naturally occurs provides a minimum test window TP for performance and transition fault testing. Thus, less sophisticated scan test equipment can now provide both transition fault and stuck fault testing, without an increase in complexity or expense.

5 Claims, 2 Drawing Sheets

LOGIC PERFORMANCE VERIFICATION AND TRANSITION FAULT DETECTION

BACKGROUND OF THE INVENTION

1. Field of the Invention

The invention relates generally to the field of logic circuit testing, and more specifically to providing an indication of the propagation delay of logic under test.

2. Background Art

Given the increasing complexity and density of current integrated circuit logic chips, the need to test the operation of the logic in a reliable and efficient manner has become more acute. One such test methodology is the so-called "level-sensitive scan design," or LSSD, test. Briefly, in LSSD testing, a chain of shift register latches (SRLs) are coupled to the inputs and outputs of the internal logic under test. Test data is scanned serially into one chain (the input chain) of shift register latches. When the input shift register is full, the data propagates through the logic under test (LUT), and is written into a second chain (the output chain) of SRLs. The acquired data is then scanned serially out and compared to the expected data. The LSSD test indicates that the logic is not functioning properly when the acquired data does not match the expected data. This general type of functionality test is referred to as "stuck fault" testing, because it determines the existence of permanent (or "stuck") errors in the logic under test.

However, in addition to confirming the functionality of the logic under test, it is also desirable to check the propagation delay through the logic. That is, even if the stuck fault test confirms that the logic achieves the desired function, the circuit will not meet its performance specifications if it cannot produce the logic signals within the allocated time. Tests that determine propagation delays and detect propagation delay failures are referred to as "performance" or transition fault tests.

There are several references that disclose logic test methodologies that provide both stuck fault and performance testing. In such systems, a critical path is defined in the logic. The test signals must propagate through this critical path within a set amount of time. Thus, stuck fault test results are provided by comparing the expected with the acquired data as described above; performance test results are provided in that if the signals do not propagate through the critical path in time, they will not be received, indicating a performance fault. See an article by komonytsky entitled, "Synthesis of Techniques Creates Complete System Self-Test", *Electronics*, Mar. 10, 1983, pp. 110-115; see also U.S. patent application Ser. No. 062,310 entitled, "Improved Delay Testing for High Speed Logic", filed Jun. 15, 1987 by Beh et al and assigned to the assignee of the present invention.

However, these techniques are impossible to implement on testers without multiple timing sets. These difficulties will be discussed below with reference to FIGS. 1 and 2, which show a conceptualized LSSD block diagram and cycle timing, respectively, for a conventional stuck fault test carried out using a test system capable of performing LSSD stuck fault tests.

As shown in FIG. 1, an SRL chain 10 is made up of two pairs 12, 14 of SRL master and slave latches L1, L2. The L1 latch of the first SRL pair 12 receives as logic inputs a first clock signal A/C, a second control signal SG (or "scan gate"); a third data signal SI0 (or "scan-in"), and a fourth data signal DI0. The L2 latch of the first SRL 12 receives as logic inputs the L1 output (not shown) and a clock signal B. The output of the first L2 latch is the SI1 data input of the L1 latch of the second SRL pair 14. Note also that the data signal DI1 is different from the data signal DI0. The remaining elements of the second SRL pair 14 are the same as those of the first SRL pair described above. In the output SRL chain 20, notice that DI0 and DI1 inputs to the L1 latches are taken from the outputs of the logic under test (box labeled "Combinational Logic (LUT)"). The remaining elements of the output SRLs receive the same inputs and provide substantially the same functions as the input SRL described above.

In operation, when the SG signal selects scan (or serial) mode, the data at the scan input SI0 or SI1 will be acquired by the L1 latch when the A/C clock pulses (by "pulse" we mean rises or falls, whichever makes the clock active. In the waveform diagram of FIG. 2, the A/C clock "pulses" when it rises). When the SG signal selects parallel mode, the data at the data input DI0 or DI1 will be acquired by the L1 latch when the A/C clock pulses. Thus, the state of the SG clock determines from which input data will be acquired by the L1 latches.

In the L2 latch, data is acquired from the L1 by pulsing the B clock. Data is generally available to the LUT directly from the L2 slave latch. Note that the output of the L2 latch is also fed, as the SI1 input, to the second L1 in each SRL chain. Thus, when SG is in serial mode and the A/C clock pulses, the L1 latches acquire the data provided by the immediately preceeding L2 latch. When SG is in parallel mode and the A/C clock pulses, the output of the previous L2 is ignored and the L1's acquire data provided at the DI0, DI1 inputs.

The conventional operation of the input and output SRL chains will now be explained in more detail with reference to the waveform diagrams of FIG. 2. The cycles C1-C8 are machine (or timing) cycles of the tester that produces the test signals. Each machine cycle introduced a new test vector or test pattern to the device under test. Such a machine cycle is usually very long in relation to the inherent speed of the device. A tester machine cycle may be more than 50× the length of delay through the device under test. During the first few machines cycles (C1, C2) the SG signal indicates that the SRLs are in serial mode. During these cycles, test data is provided one bit at a time at the SI0 input to the L1 latch of SRL pair 12. In cycle C1, a first test bit is latched by the first SRL pair 12 (i.e., the A/C clock pulses to cause the L1 to latch the test bit, and then the B clock pulses to cause the L2 to latch the test bit). In cycle C2, the first test bit (available at the SI1 input from the L2 latch of SRL pair 12) is latched by the second SRL pair 14, and a second test bit is latched by the first SRL pair 12. Thus, by the end of cycle C2, the first test bit is provided at the L2 output of the second SRL pair 14 and the second test bit is provided at the L2 output of the first SRL pair 12.

In this particular example, by the end of cycle C2 the serial scan of test data is complete. In practice, there would be many more pairs of L1-L2 latches in the input SRL than the two SRL pairs shown in FIG. 1; however, it is to be understood that the present operational description applies equally well to such implementations wherein the two L1-L2 pairs shown in FIG. 1 constitute the last two SRL pairs of the input SRL chain. Similarly, in practice, there may be several such chains of L1, L2 latch pairs which feed data to the logic of the device under test. All such L1 and L2 would be controlled simultaneously in the same manner as described herein.

In cycle C3, the SG clock changes to switch from serial mode to parallel mode. Note that no other clock signals change state during this cycle, in order to ensure that the SG clock has fully propagated before proceeding.

In cycle C4, when the A/C clock pulses data presented at the DI0, DI1 inputs of the SRLs is acquired by the L1s. In the output SRL chain 20, the logic data (or data bits) from the LUT are available at the inputs DI0 and DI1 of the third and fourth SRL pairs 22, 24 respectively. Since SG is in parallel mode, whatever data is available at the SI data input is not acquired by the L1s. In cycle C5, the B clock pulses, causing L2 latches to acquire the data from the L1 latches. Note that the activation of the respective A/C and B clocks to operate the output SRLs in parallel mode occurs in separate cycles C4, C5. This is to ensure no clock overlap which would create a "flush" condition (i.e., passage of data without latching).

Then, during cycle C6, the SG signal input selects serial mode, such that the operational mode of the SRLs changes from parallel back to serial. In cycle C7 the data bits on the device under test primary output pins are acquired. Beginning in cycle C8, the data bits are scanned out from the output SRL chain 20 in the same manner as the test bits were scanned into the input SRL chain 10. That is, when the A/C clock pulses in cycle C8, the data bit from the L2 latch of the third SRL pair 22 is latched by the L1 of the fourth SRL pair 24 via the SI1 input. When the B clock pulses the data bit is latched by the L2 of the fourth SRL pair 24, for scanning out by the tester. At the same time, the L2 of the third SRL pair 22 has latched a data bit from a previous L1-L2 pair (if there is one).

In the standard stuck fault test cycle described above, a wide time window is presented that is not conducive to performance verification and transition fault testing. As shown in FIG. 2, the final bit test pattern starts propagating through the logic as soon as the B clock in cycle C2 activates. In order to provide a valid result, the data must reach the L1 latches of the output SRL's by the time the A/C clock deactivates in cycle C4. While this allocated propagation delay (hereinafter "test window",) indicated as "TP" in FIG. 2 may not appear to be troublesome, in practice each tester cycle can be up to 50× the width of the test machine cycle. As an example, if the clock pulses are 20 nanoseconds wide, the test window TP could be over one microsecond. Most of the time is allowed for settling. As a practical matter, depending on the chip processing technology, most logic circuits are designed to have a propagation delay of far less than the machine cycle. Thus, using conventional stuck fault LSSD clocking patterns, performance/transition fault testing cannot be accomplished.

The need for a performance test occurs at two different intervals in the manufacturing process. The first interval at which a performance test is needed is initial design verification. That is, when initial production parts are available, a performance test is needed to verify that both the logic design and the manufacturing process are capable of producing chips that meet the performance specifications. The second interval at which a performance test is needed is volume manufacturing screening. That is, during volume production, chips are analyzed to determine if (a) the particular chip meets the performance specification (i.e., no performance related defects), and (b) the manufacturing process is providing product on-spec.

Accordingly, there is a need in the art for a scan test that can provide both stuck fault and transition fault testing without adding appreciable complexity or expense to the overall test system.

SUMMARY OF THE INVENTION

It is thus an object of the present invention to provide a scan test that can perform both stuck fault and transition fault testing.

It is another object of the invention to provide both stuck fault and transition fault scan testing without adding complexity or expense to the total test system.

The above and other objects of the invention are realized by activating the B clock before the A/C clock in each tester cycle. Thus the periodicity of the clocks does not have to be changed for a particular cycle, because in one cycle the B-to-A/C clocking that naturally occurs provides a minimum test window TP. Thus, any scan test equipment that can provide today's stuck fault LSSD test can now provide both stuck fault and transition fault testing, without an increase in complexity or expense.

BRIEF DESCRIPTION OF THE DRAWING

The foregoing and other features of the invention will now be explained in more detail with reference to the enclosed Drawing, in which.

DESCRIPTION OF THE BEST MODE FOR CARRYING OUT THE INVENTION

Figure 2:
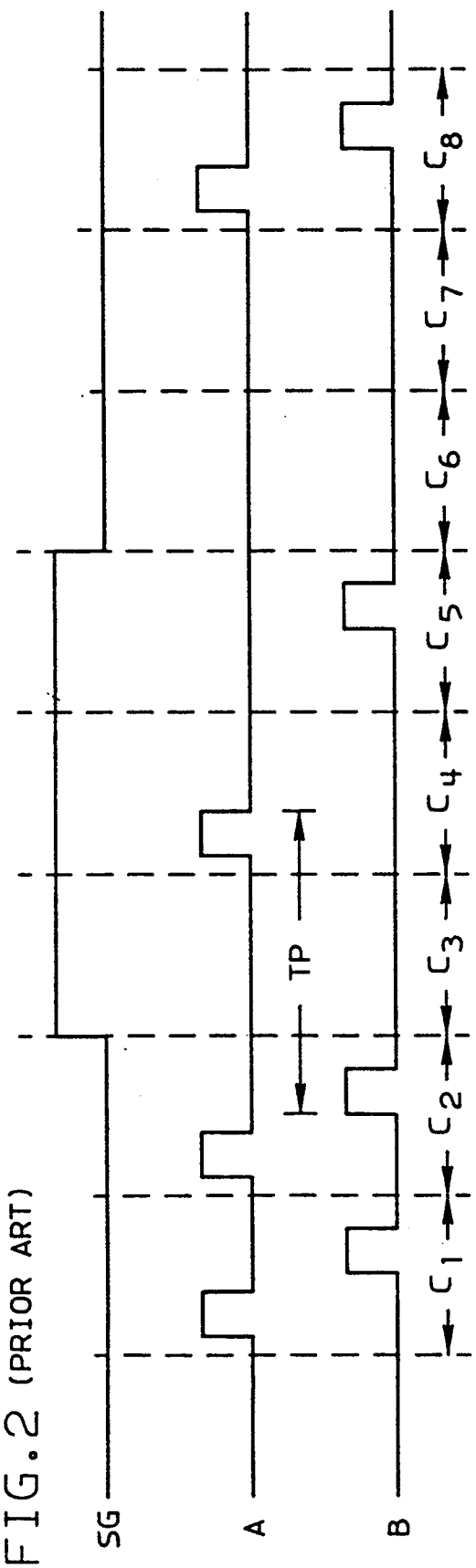
FIG. 2 (Prior Art) is a representative waveform diagram of the clock signals shown in FIG. 1.
Figure 3:
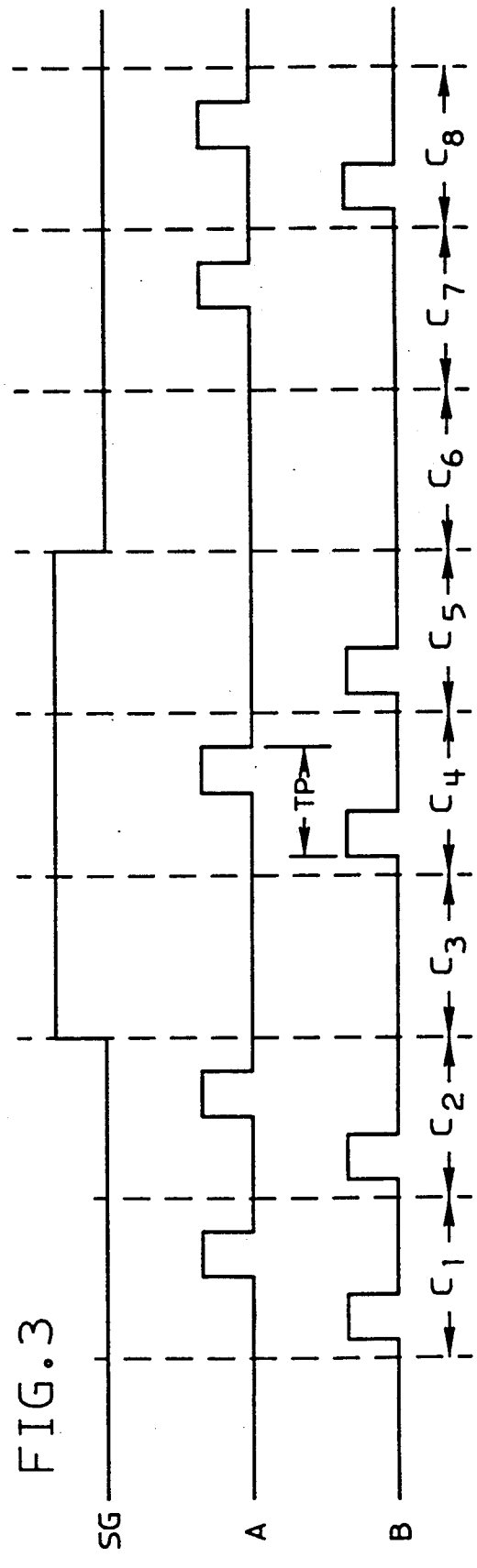
FIG. 3 is a waveform diagram of the clock signals of the present invention.

As shown in FIG. 3, in the present invention the B clock occurs before the A/C clock in all machine cycles in which the A/C and B clocks are generated. That is, the B clock occurs early in the cycle, and the A/C clock occurs later in the cycle. This is the opposite of the periodicity for the conventional clock sequence shown in FIG. 2. Furthermore, both the B and A/C clocks occur in exactly the same place within the cycle, thereby requiring only one timing set for the tester.

Figure 1:
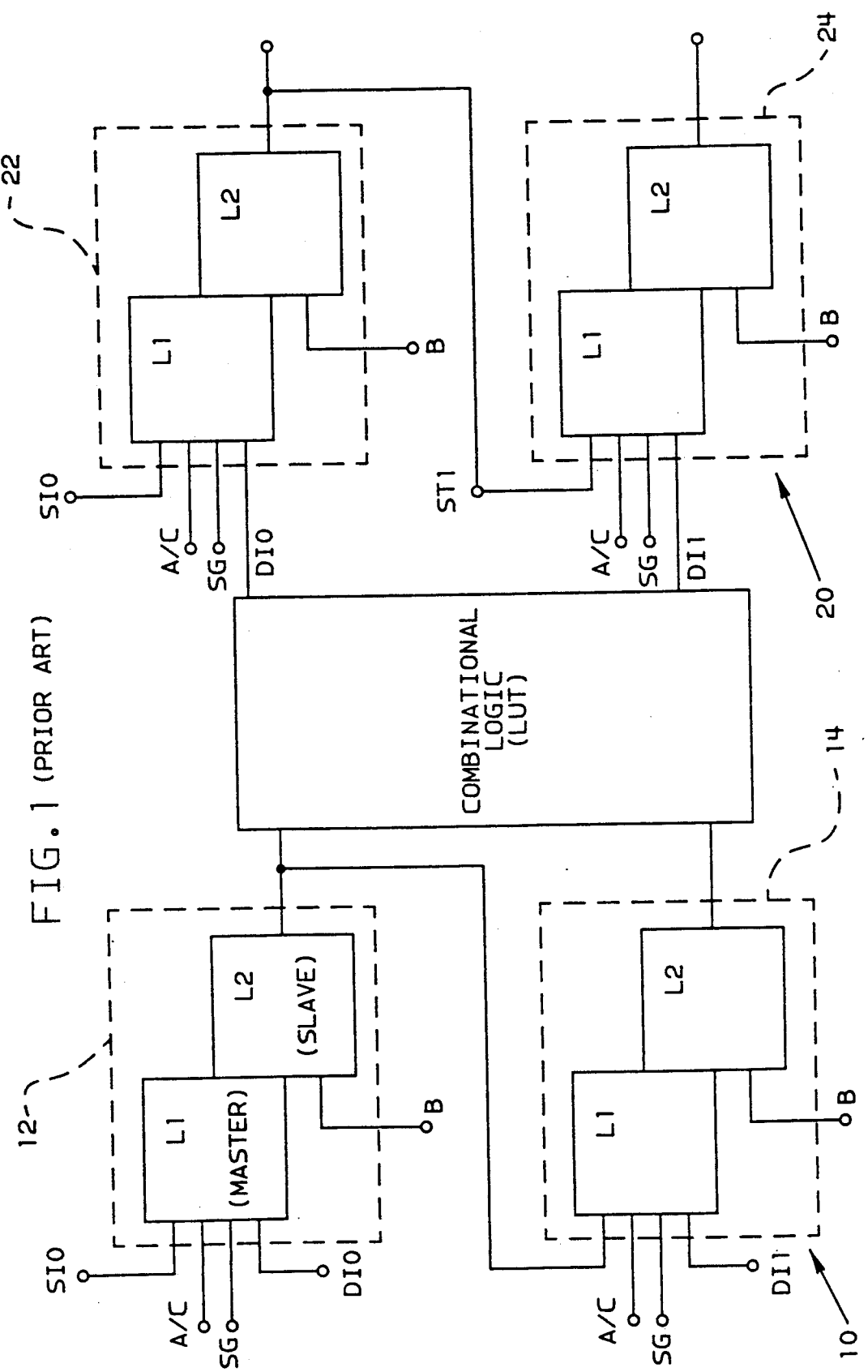
FIG. 1 (Prior Art) is a schematic diagram of a representative scan test system in the prior art.

The operation of the scan test system of FIG. 1 utilizing the clocking sequence of FIG. 3 will now be described. In cycles C1 and C2, data is serially shifted into the input SRL chain 10. Note that the SG signal of FIG. 3 has exactly the same waveform as the SG signal of FIG. 1. Thus, in cycles C1 and C2, the SG signal is in serial mode. When the B clock pulses in C1, whatever test bits are provided at the inputs to the L2 are latched. For ease of explanation, assume no test bits are at the L2 inputs at this time (in practice, with an input SRL chain of conventional length, such test bits would be available). When the A/C clock pulses in cycle C1, the first test bit will be available at the SI0 input, and will be latched by the L1 of the first SRL pair 12. Then in cycle C2, the B clock pulses, causing the first test bit to be latched by the L2 of pair 12. When the A/C clock pulses in cycle C2, the first test bit is acquired by the L1 of the second SRL pair 14, and is thus available to the corresponding L2 latch. At the same time, the second test bit is acquired by the L1 of the first SRL pair 12, and similarly this test bit is available to its corresponding L2 latch.

As illustrated above, the effect of having the B clock pulse before the A/C clock in each cycle is to transfer test bits from one SRL pair to the next within a single tester cycle. In the conventional stuck fault test sequence shown in FIG. 2, transfer of test bits from one L1-L2 pair to the next occurs between tester cycles.

The significance of this difference is illustrated by comparing the relative position of the test bits at the end of the C2 cycle for both FIG. 2 (conventional stuck fault testing) and FIG. 3 (invention). At the end of the C2 cycle in FIG. 2, the complete test bit pattern has been acquired by the L2 input SRL's, such that the test bits have started propagating through the logic under test. At the end of the C2 cycle in FIG. 3, the complete test bit pattern has not been acquired by the L2 latches—rather, it is available at the inputs to the L2 latches. Thus, in the invention the complete test bit pattern does not start propagating through the logic under test at the end of the C2 cycle. Thus, during the intervening cycle C3 in which the SG clock activates to change the operation of the L1 latches from serial to parallel mode, the test bits are "held" within the L1 input SRLs; whereas, in the process of FIG. 2, the test bit pattern is allowed to propagate through the logic under test throughout the C3 cycle, causing a wide gap in the test window TP.

With reference to FIG. 3, in cycle C4 the B clock pulses to latch the complete test bit pattern into the L2 latches of both SRL pairs 12, 14, such that the test bits start to propagate through the logic under test. Later in cycle C4, the A/C clock pulses. Since the SG signal is in parallel mode during cycle C4, the L1 latches of the outputs SRLs will acquire the data available from the logic at the inputs DI0 and DI1. Thus by the time the A/C clock deactivates in cycle C4, all the data bits must be completely latched by the L1's in order to be valid. In the C5 cycle, the B clock is pulsed to write the L1 test data bits into the L2's, and after cycle C6 (during which the SG clocks deactivates to change the L1 operation from parallel to serial mode) the A/C clock pulses in C7 to begin the process of serially shifting the test data bits out of the output SRLs.

Referring to both FIG. 2 and FIG. 3, the significance of the invention is illustrated by comparing the test window TP. In the invention (FIG. 3), by having the B clock occur before the A/C clock, the system can be switched from serial to parallel mode in cycle C3 before the data is made available at the L2 latches of the input SRL. In other words, the data can be acquired by the input L2 latches, propagated through the logic under test, and acquired by the output L1 latches, all within one cycle (the C4 cycle). Thus, by utilizing B before A/C clocking, test bits are transferred from one L1-L2 pair to another within one machine cycle as opposed to between machine cycles as in the prior art, such that the serial/parallel mode can be switched prior to initiating the final B clock that makes the data available at the outputs of all the L2 latches of the input shift register latch.

Thus, because there is no intervening cycle, the invention presents a test window that can be as narrow as the two clocks added together. For example, again assuming a pulse width of 20 ns and a zero delay between clock pulse edges, the invention produces a test window TP of 40 ns (i.e., the combined width of the A/C and B pulses), as opposed to TP greater than 1 microsecond from the stuck fault test. It would be a simple matter to increase the length of time between clock pulse edges (that is, to introduce some delay between the trailing edge of the B clock and the leading edge of the A/C clock) and/or to decrease the pulse width of the clocks, to optimize test window TP to match the performance specification of the logic under test.

In addition to changing the clocking to have B occur before A/C, two pulses were added to provide the test results. In comparing cycle C4 in FIGS. 2 and 3, note that a B pulse occurs in FIG. 3 that is not present in FIG. 2; in cycle C7, note that an A/C pulse occurs in FIG. 3 that is not present in FIG. 2. These pulses are added to FIG. 3 to compensate for the B before A/C clocking. In cycle C4, the B clock is needed to complete the loading of the input SRLs to stimulate the logic. In cycle C7, the A/C clock is added so that serial scanout of acquired data from each output SRL will be correctly time-aligned with the expected data.

Thus, the invention provides a highly flexible and accurate performance and transition fault test without introducing complexity or cost to the test equipment. More conventional test equipment cannot change the periodicity of the clocks in different cycles; that is, the timing of the rise and fall transition (edges) of the respective clocks must be the same for all cycles in which the A/C, B clocks are generated. By changing the periodicity of the clock signals for all cycles as described herein, a narrow test window is defined without adding cost/complexity by requiring a variation in the A, B periodicity for only one particular cycle. In fact, the invention can be utilized in conjunction with any test equipment that can run normal stuck fault tests.

A feature of the invention is that both transition fault and stuck fault testing can be carried out at once. That is, when the output test data indicates an error, the error can be due to either a stuck fault or a transition fault. If one wishes to find out whether the error is stuck fault or transition fault, the tester could separately run both the prior art stuck fault test (A/C before B) and the transition fault test of the invention (B before A/C). If the logic passes the stuck fault test but fails the transition fault test, then there is a signal propagation problem. If the logic fails both tests, a stuck fault is indicated.

It is to be understood that the scope of the invention should not be construed as being limited to the best mode as described above. For example, while the invention has been specifically described with reference to LSSD testing, it could also be used in conjunction with other logic testing techniques such as boundary scan and other scan testing methods.

What is claimed is:

1. In a scan test system operated in a plurality of machine cycles to test a logic network, the test system comprising a first means having a first portion for receiving test data and a second portion for sending the received test data to the logic network, a second means having a first portion for receiving data from the logic network and a second portion for sending such data to an analyzer, a first signal source for producing a first clock signal that enables the first portions of the first and second means, and a second signal source for producing a second clock signal that enables the second portions of the first and second means, an improved method for gauging the propagation delay of the logic network, comprising the steps of:

writing test data serially into the first means by iteratively strobing the second clock signal and then the first clock signal in sequence for a plurality of timing cycles until all test data is received by the first means;

sending test data in parallel from the second portion of first means to the logic network by strobing the second clock signal, and receiving corresponding logic data from the logic network by the first portion of the second means by subsequently strobing the first clock signal, during the course of a single machine cycle, so as to provide a test window commensurate with the expected propagation delay of the logic network; and reading said logic data out of the second means, by iteratively strobing the second clock signal and then the first clock signal in sequence for a plurality of timing cycles until all logic data is read.

2. In an apparatus for carrying out a scan test sequence on logic circuitry in a plurality of machine cycles, the apparatus comprising an input latch chain comprising a plurality of members for providing test data to the logic circuitry, and an output latch chain comprising a plurality of members for providing corresponding logic data from the logic circuitry to a comparator, an improved test sequence comprising transferring said test data from the input latch chain through the logic circuit, and latching said corresponding logic data in the output latch chain, within a single machine cycle, so as to provide a transition fault test window commensurate with the expected propagation delay of the logic circuit.

3. The method as recited in claim 2, wherein said data transfers are accomplished by strobing a first clock signal that causes data to be transferred between members of said latch chains, and strobing a second clock signal that causes data to be latched by members of said latch chains.

4. The method as recited in claim 3, wherein said first clock signal is always strobed before said second clock signal.

5. In an apparatus for carrying out an LSSD test sequence on logic under test in a plurality of machine cycles, the apparatus comprising an input SRL chain comprising a plurality of L1-L2 latch pairs, wherein the outputs of said L2 latches of said input SRL chain are coupled to inputs to the logic under test, and an output SRL chain comprising a plurality of L1-L2 latch pairs, wherein the inputs of said L1 latches of said output SRL chain are coupled to outputs from the logic under test, wherein the L1 latches are enabled by an A/C clock and the L2 latches are enabled by a B clock, a method for carrying out transition fault testing on the logic under test, comprising triggering the B clock before the A/C clock within a single machine cycle, so that logic signals are propagated through the logic under test to define a test propagation window commensurate with the expected propagation delay of the logic under test for transition fault testing.

* * * * *